United States Patent
Bylsma et al.

(10) Patent No.: US 6,704,472 B2
(45) Date of Patent: Mar. 9, 2004

(54) OPTOELECTRONIC DEVICE HAVING AN INTEGRATED CAPACITOR FORMED THEREON AND METHOD OF MANUFACTURING THE SAME

(75) Inventors: Richard B. Bylsma, Allentown, PA (US); Leonard J-P. Ketelsen, Clinton, NJ (US)

(73) Assignee: TriQuint Technology Holding Co., Hillsboro, OR (US)

( * ) Notice: Subject to any disclaimer, the term of this patent is extended or adjusted under 35 U.S.C. 154(b) by 57 days.

(21) Appl. No.: 09/993,425

(22) Filed: Nov. 5, 2001

(65) Prior Publication Data

US 2003/0086635 A1 May 8, 2003

(51) Int. Cl.[7] .............................. G02B 6/12; G03H 1/00; G02F 1/35; H01L 31/0232
(52) U.S. Cl. .......................... 385/14; 359/34; 359/332; 257/432
(58) Field of Search ................. 359/34, 332; 385/14; 257/432; 438/27, 31, 32

(56) References Cited

U.S. PATENT DOCUMENTS

| | | | | |
|---|---|---|---|---|
| 4,735,677 A | * | 4/1988 | Kawachi et al. | 156/633 |
| 6,040,590 A | * | 3/2000 | O'Brien et al. | 257/94 |
| 6,472,694 B1 | * | 10/2002 | Wilson et al. | 257/189 |
| 6,479,844 B2 | * | 11/2002 | Taylor | 257/192 |

* cited by examiner

Primary Examiner—John F. Niebling
Assistant Examiner—Viktor Simkovic

(57) ABSTRACT

The present invention provides an optoelectronic device, a method of manufacture thereof and an integrated optoelectronic system incorporating the same. The optoelectronic device may be a tunable laser that includes a capacitor located over one of the first outer surface or the second outer surface. The outer metal layers of the tunable laser can be used to form a first electrode of the laser, after which a dielectric layer and a second electrode are deposited and patterned to form the laser having a capacitor incorporated thereon.

9 Claims, 3 Drawing Sheets

OPTOELECTRONIC DEVICE HAVING AN INTEGRATED CAPACITOR FORMED THEREON AND METHOD OF MANUFACTURING THE SAME

TECHNICAL FIELD OF THE INVENTION

The present invention is directed, in general, to optical communications systems and, more specifically, to an optoelectronic device having an integrated capacitor formed thereon.

BACKGROUND OF THE INVENTION

The bit-rate of optical fiber communications has increased significantly in recent years. However, transmission bit-rate has been restricted by the bandwidth of electrical circuits located in both the transmitter and receiver portions of optical telecommunications systems. As a means for increasing transmission capacity without being electrically restricted with respect to transmission speed, wavelength division multiplexing (WDM) transmission systems have been developed to overcome the dispersion of the optical fibers that limit the propagation length of high bit-rate signals.

In such systems, various manufacturers have proposed WDM systems using 40 or 80 wavelengths spaced by 100 or 50 GHz at 2.5 Gbit/sec. To simplify the wavelength management of such systems, wavelength tunable semiconductor lasers have become popular by offering the ability to increase the capacity, functionality and flexibility of such optical fiber networks. Potentially, such tunable lasers can simplify the architecture of such systems, as well as reduce their operating costs.

In addition, the importance of wavelength tunable lasers has been growing in fields other than WDM transmission systems, such as wavelength division switching systems, wavelength cross-connection systems, as well as in the field of optical measurement. No matter what the application, among the more popular choices for such tunable lasers are Distributive Bragg Reflector (DBR) semiconductor lasers. DBRs are made up of a multiplicity of transparent layers in which alternating layers of different indexes of refraction are formed typically by epitaxial growth and carriers can be injected through the DBR and into the optically active region. Wavelength tuning is accomplished with a tuning region within the DBR that uses a change in electrical current to finely tune the wavelength of the laser generated by the device.

Current optical fiber telecommunication systems are ideally suited for DBR lasers primarily because of their wavelength tunable characteristic. In fact, in such systems, it is well known that the use of DBR lasers results in a considerable increase both in transmission capacity and transmission speed. Unfortunately, problems with DBR lasers during operation commonly prevent such lasers from optimizing transmission within the optical networks. One particular problem is fluctuation in the current used by the tuning region of the laser to adjust the wavelength of the output. More specifically, current changes in other parts of a DBR laser, caused by the numerous radio frequency (RF) signals found throughout the device, typically lead to current leakage into the tuning region (commonly referred to as "crosstalk"). This current leakage often causes changes in the reflective spectrum of the grating located within the tuning region, which eventually changes the wavelength that is set by the tuning region. As a result, the laser generated by the DBR laser may have an undesirable wavelength. Furthermore, inductive pick-up by the device of RF signals in the device environment may lead to similar undesirable effects.

Perhaps the most common solution to the cross-talk problem is the use of a capacitor to filter the RF signals (and thus current leakage) traveling into the tuning region. Specifically, it has been discovered that a capacitor may be used to short-circuit these RF signals to ground, allowing the tuning region to control current flow within itself regardless of RF signal/current fluctuations occurring throughout the device. While the bonding of these discrete capacitor components with other electro-optic and optical components is possible, problems arise due to interaction of the specific attachment processes and wire bond length.

Accordingly, what is needed in the art is an optoelectronic device, for use with tunable lasers, that does not suffer from the deficiencies found in the prior art.

SUMMARY OF THE INVENTION

To address the above-discussed deficiencies of the prior art, the present invention provides an optoelectronic device. In one embodiment, the optoelectronic device includes a substrate having a first doped region adjacent a first outer surface and a second doped region adjacent a second outer surface. In addition, the optoelectronic device includes a wave guide located in the substrate and located between the first outer surface and the second outer surface. The optoelectronic device still further includes a capacitor located over one of the first outer surface or the second outer surface. The capacitor structure may be located on either one side or both sides as design may require.

In another aspect, the present invention provides a method of manufacturing an optoelectronic device. In one embodiment, the method includes forming a first doped region adjacent a first outer surface of a substrate, and forming a second doped region adjacent a second outer surface of the substrate. The method further includes creating a waveguide in the substrate, and forming a capacitor over one of the first outer surface or the second outer surface.

In yet another aspect, the present invention provides an integrated optoelectronic system. In one embodiment, the system includes at least one optical device having an optical substrate with a first doped region adjacent a first outer surface and a second doped region adjacent a second outer surface. At least one of the optoelectronic devices also includes a waveguide located in the substrate and located between the first outer surface and the second outer surface. In addition, this optoelectronic device includes a capacitor located over one of the first outer surface or the second outer surface. The integrated optoelectronic system further includes an optical fiber that is coupled to the optical device and is located on or within the semiconductor substrate. In addition, the system includes a detector coupled to the at least one optical device.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
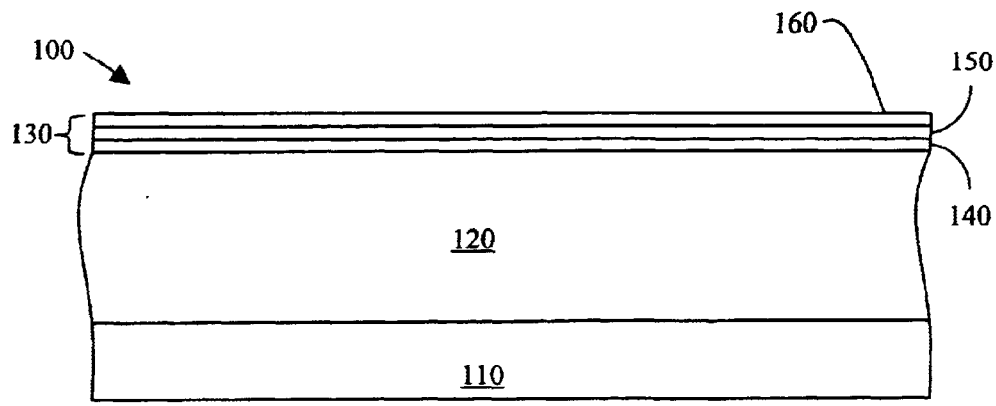
FIG. 1 illustrates an initial device during an early stage of one manufacturing process according to the principles of the present invention.

Referring initially to FIG. 1, illustrated is an initial device 100 of one embodiment during an early stage of a manufacturing process conducted according to the principles of the present invention. As illustrated, the device 100 is constructed on a substrate, such as an optoelectronics substrate. In one embodiment, the substrate is comprised of a P-type doped region 110 and an N-type doped region 120. In accordance with conventional practice, the P-type doped region 110 may be manufactured from indium phosphide (InP) using zinc (Zn) as a dopant and the N-type doped region 120 may be manufactured from InP using silicon (Si) as a dopant. Of course, other suitable and well known optoelectronic materials may also be used.

In an advantageous embodiment, the P-type doped region 110 is formed using P-type dopants conventionally introduced into the InP. The P-type dopants may include zinc (Zn), carbon (C), or other suitable materials, however the present invention is not limited to any particular P-type dopant. In a related embodiment, the N-type doped region 120 is formed by conventionally introducing N-type dopants into the InP. The N-type dopants used may include a Si dopant, however, again, the present invention is not limited to any particular N-type dopant to form the N-type doped region 120.

A contact metal layer 130 is then formed over the N-type doped region 120 on one side of the substrate. In an exemplary embodiment, the contact metal layer 130 may be formed from three separate layers, as illustrated in the embodiment depicted in FIG. 1. In such embodiments, a first metal layer 140 is deposited over the N-type doped region 120. The first metal layer 140 may be formed by depositing gold germanium (AuGe) using conventional techniques, such as electron beam evaporation. A second metal layer 150 may then be deposited over the first metal layer 140 by depositing, for example, titanium platinum (TiPt). In an alternative embodiment, the second layer 140 is comprised of two discrete layers, one of Ti and one of Pt. A third metal layer 160, for instance, a thick layer of Au, may then be deposited over the second metal layer 150. Conventional techniques may be used to deposit any or all of the metal layers 140, 150, 160. In addition, although specific materials used to form the contact metal layer 130 have been discussed herein, these examples are merely for illustrative purposes and should not be construed to limit the present invention in any way.

Figure 2:
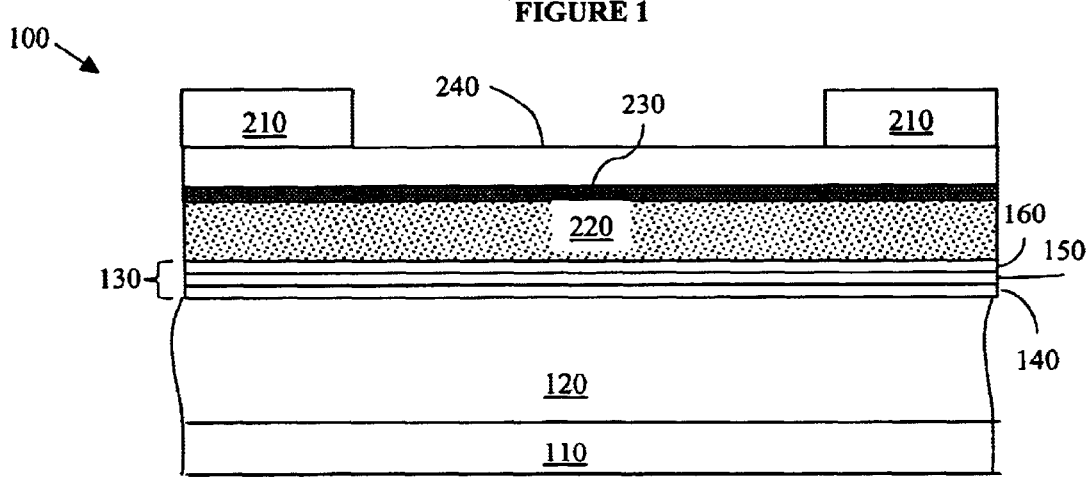
FIG. 2 illustrates the initial device of FIG. 1 during a latter stage of a manufacturing process according to the principles of the present invention.

Turning now to FIG. 2, illustrated is the initial device 100 of FIG. 1 during a latter stage of manufacturing. A dielectric layer 220 is conventionally deposited on the contact metal layer 130, which will later serve as a first electrode of a capacitor. In an exemplary embodiment, the dielectric 220 may be comprised of silicon dioxide ($SiO_2$), however, the dielectric 220 may also be tantalum pentoxide ($Ta_2O_5$) or other well known dielectric materials used in semiconductor manufacturing processes.

In an alternative embodiment, an adhesion layer 230 may be deposited over the dielectric layer 220. Thereafter a second metal layer 240, which will later serve as a second capacitor electrode is deposited over the adhesion layer 230. Of course, in those embodiments where the adhesion layer 230 is not present, the second metal layer 240 is deposited directly over the dielectric layer 220. The adhesion layer 230 may be comprised of conventional material, such as titanium, and is deposited to promote good adhesion between the dielectric layer 220 and the second electrode 240. The second electrode 240 may be formed with conventional processes and materials. For example, the second electrode 240 may be Au. Following the deposition of the above mentioned layers, a mask 210, such as photoresist, is conventionally deposited and patterned. The contact metal layer 130, the dielectric layer 220, the adhesion layer 230, if present, and the second metal layer 240 are then conventionally etched to form a capacitor as illustrated in FIG. 3 and discussed below.

Figure 3:
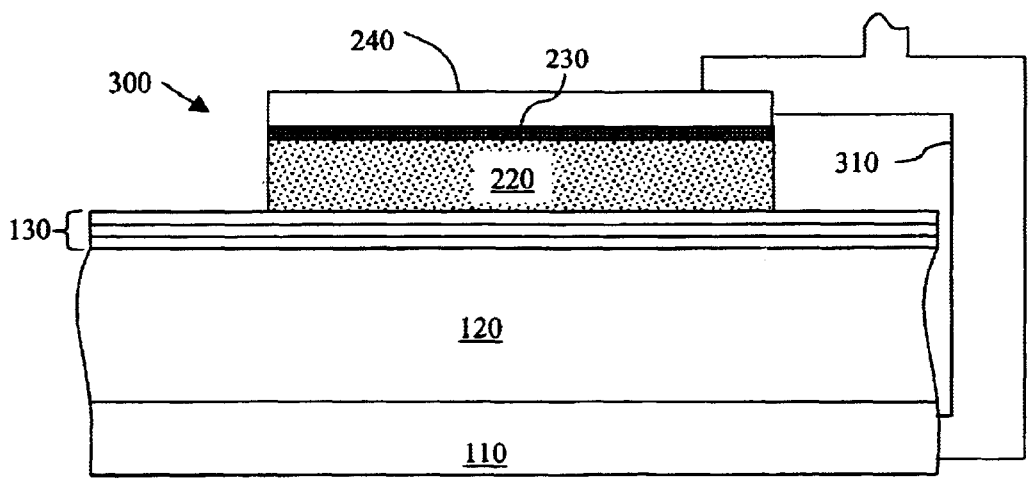
FIG. 3 illustrates one embodiment of a finished capacitor manufactured according to the principles of the present invention.

Referring now to FIG. 3, illustrated is a completed capacitor 300 structure manufactured according to the principles of the present invention subsequent to the etching processes mentioned above and removal of the mask 210. As shown, the capacitor 300 includes the contact metal layer 130 as the first electrode, the dielectric layer 200, and the second electrode 240.

Also illustrated is a conventionally formed interconnect 310. The interconnect 310 is used to electrically couple the second electrode 240 to the P-type doped region 110 of the substrate. With the capacitor's 300 first electrode (the contact metal layer 130) electrically coupled to the N-type doped region 120, which is in turn coupled to ground, the interconnect 310 allows the capacitor 300 to short-circuit unwanted RF signals typically found within the P-type doped region 110.

Figure 4:
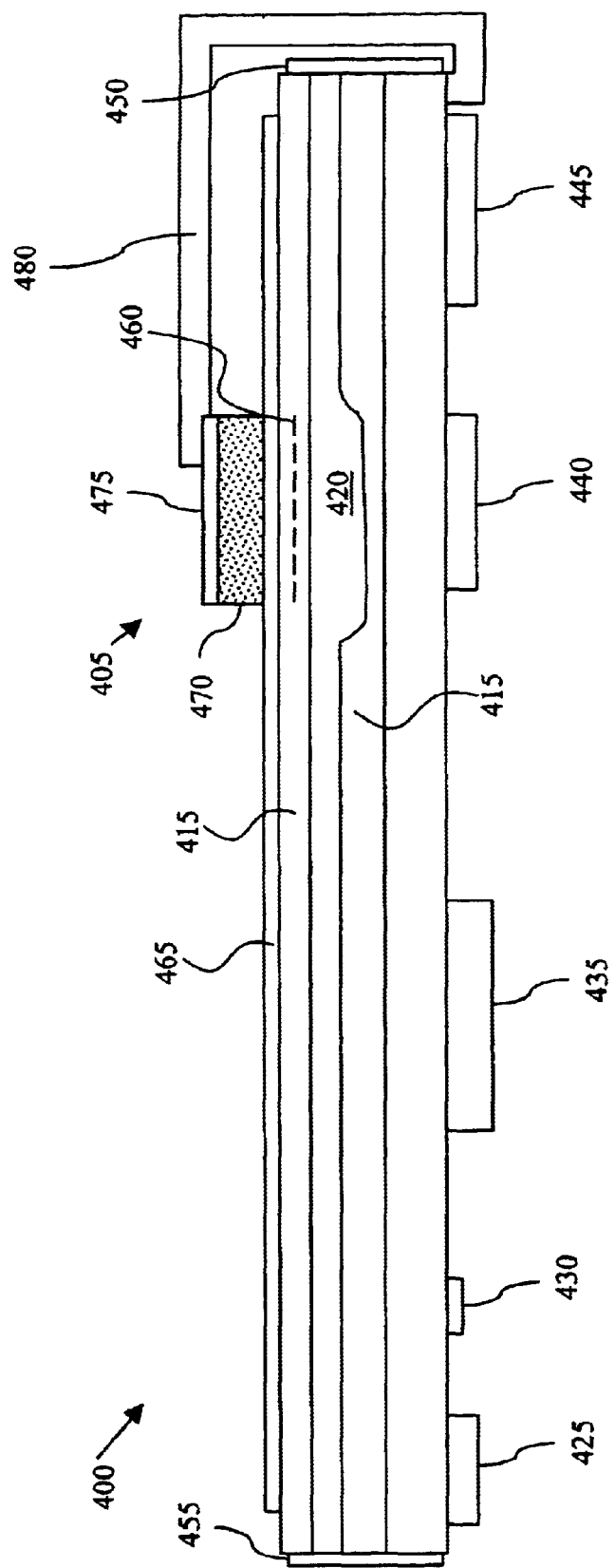
FIG. 4 illustrates one embodiment of an optoelectronic laser incorporating a capacitor manufactured according to the principles of the present invention.

Looking now at FIG. 4, illustrated is one embodiment of an optoelectronic tunable laser 400 incorporating a capacitor 405, as described above. In an advantageous embodiment, the laser 400 may be a Distributive Bragg Reflector (DBR) laser. Those skilled in the art are familiar with DBR lasers, as well as their uses and operation. The laser 400 includes a P-type doped region 410 formed along a first side of the laser 400, and an N-type doped region 420 formed along a second side. In addition, the capacitor 405 is formed over the second side. As shown, the capacitor 405 is integrated directly onto one contact of the tunable laser 400 such that, either by etching down to or wirebonding to the other contact, the undesirable high frequency signals will be shunted filtered out without changing or modulating the laser wavelength.

The laser 400 further includes a waveguide 420 created between the first and second sides of the laser 400. In accordance with conventional practice, the waveguide 420 may be used as an optical channel through which a laser beam generated by the laser 400 passes. As illustrated, an electro-absorbative (EA) modulator region 425 is also formed along the first side of the laser 400. The modulator region 425 may be conventionally formed and be used to modulate the output of the laser 400. Proximity of the capacitor 405 to the tunable laser 400 is important, with shorter distances being more advantageous. These shorter distances are particularly important at high modulation speeds, for example 10 Gb/sec. Thus in one exemplary embodiment, the modulator region 425 may modulate at a rate of about 2.5 Gbit/sec to about 10 Gbit/sec. Of course, other modulation rates may be employed without departing from the scope of the present invention.

Also included on the laser 400 is a photodiode 430. Those skilled in the art understand that the photodiode 430 may be used to indicate the power output of the laser 400. An amplifier region 435, which may be a semiconductor optical amplifier, is also shown formed on the first side of the laser 400. Also illustrated in FIG. 4 is a gain region 440 of the laser 400, which is also well known to those who are skilled in the art. A tuning region 445 that is located on the second side of the laser is also illustrated. As illustrated, the modulator region 425, the photodiode 430, the amplifier region 435, the gain region 440 and the tuning region 445 are all associated with the P-type doped region 410. A grating 460 is also illustrated in the N-type doped region 415 for diffracting incoming light used by the laser 400.

A high reflection (HR) coating 450 is formed on one end of the laser 400, and an anti-reflection (AR) coating 455 is formed on the output end, in accordance with conventional practice. A contact metal layer 465 is formed over the N-type doped region 415 and is used as a first electrode of the capacitor 405. The capacitor 405 also includes a dielectric 470, formed over the contact metal layer 465, as well as a second electrode 475 formed over the dielectric 470. As mentioned with respect to FIG. 3, the first and second electrodes 465, 475 may be formed from any suitable materials, including but not limited to Au and AuGe. Likewise, the dielectric 470 may be formed from a suitable dielectric material, such as $SiO_2$ or $Ta_2O_5$, but is not limited to any particular material.

The tuning region 445 is sensitive to changes in electrical current within the laser 400. This characteristic allows the tuning region 445 to be used to generate a desired wavelength of an output laser beam as a function of an applied change in current. Thus, in essence, intended changes in current result in corresponding changes in wavelength of the output. Unfortunately, as discussed above, RF signals emanating from one or more of the components of the laser 400, and traveling throughout the different portions of the laser 400, often inadvertently cause unwanted and unintended current fluctuations in the tuning region 445. Such inadvertent changes in current inevitably alter the wavelength generated by the laser 400 often to an undesirable length. In accordance with the principles described herein, forming the capacitor 405 on the laser 400 allows these unwarranted changes in output wavelength to be substantially reduced or even eliminated.

To reduce the effect of such RF signals in the tuning region 445, and thus reduce fluctuation in the wavelength of the output, the first electrode of the capacitor 405 (the contact metal layer 465) is associated with the N-type doped region 415. Conversely, the second electrode 475 of the capacitor 405 is associated with the P-type doped region 410 via an interconnect 480. With the first electrode 465 associated with the N-type doped region 415 and the second electrode 475 associated with the P-type doped region 410, the capacitor 405 may be used to short-circuit unwanted RF signals to ground rather than have them interfere with the wavelength established by the tuning region 445.

By providing an optoelectronic device having a capacitor formed over one side thereof, the present invention provides several benefits over the prior art. For instance, by providing a capacitor on an optoelectronic device, the present invention provides for more efficient RF signal filtering, resulting in reduced current fluctuations in the tuning region of the device, than previously found in the art. The closer a filtering capacitor is mounted to an optoelectronic device, such as a DBR laser, the more substantial the filtering it may accomplish. Moreover, the principles of the present invention described herein are employable in the manufacture of almost any type of optoelectronic device which may suffer from stray or unwanted RF signals, including but not limited to tunable lasers, photodetectors such as photodiodes, while retaining benefits such as those described above. In those embodiments directed towards photodetectors, those skilled in the art will be able to determine the different values of capacitance that may be used to reduce or eliminate unwanted RF signals.

Figure 5:
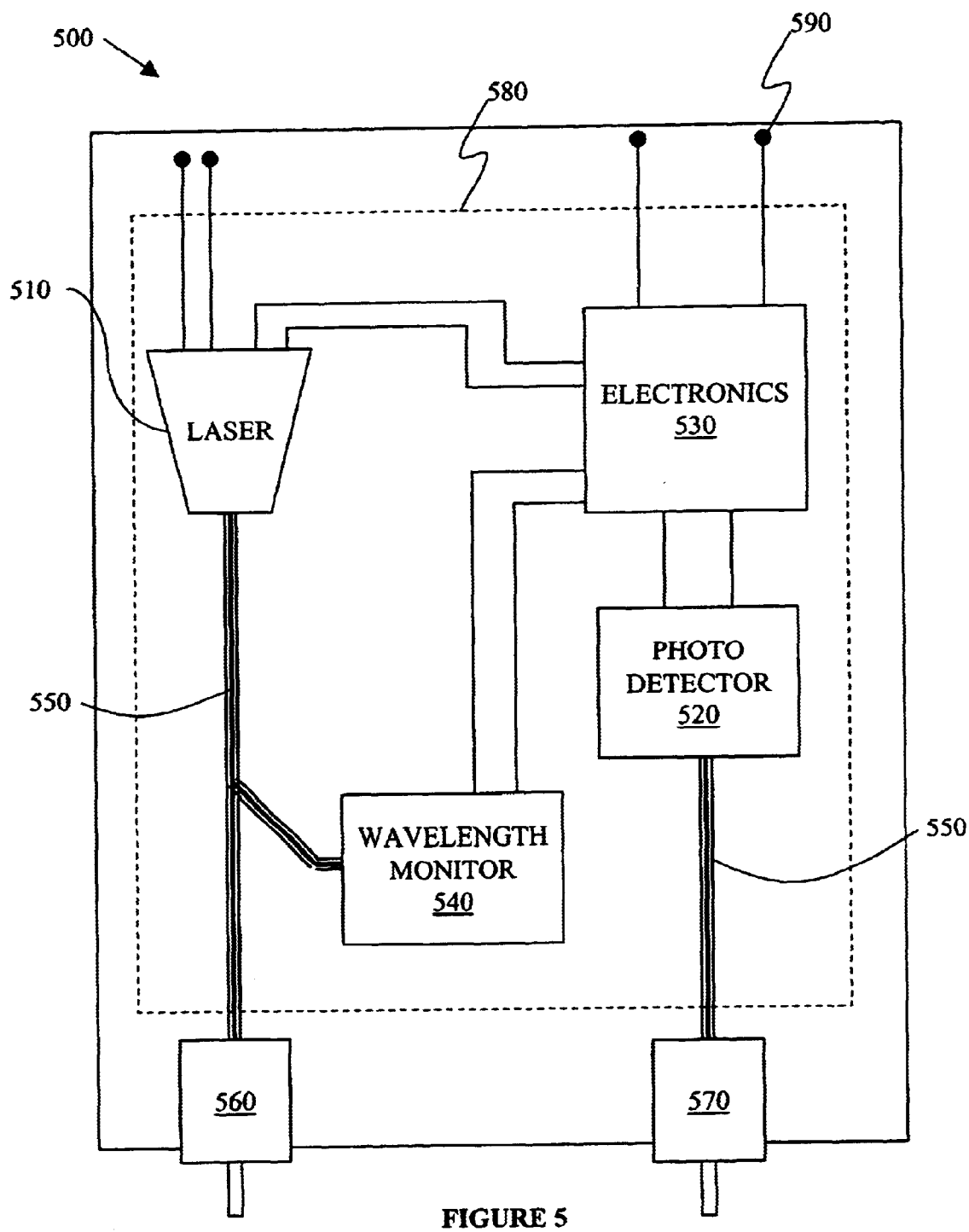
FIG. 5 illustrates an integrated optoelectronic system manufactured according to the principles of the present invention.

Turning finally to FIG. 5, illustrated is an integrated optoelectronic system 500 manufactured according to the principles of the present invention. In accordance with conventional practice, the system 500 may be employed in several optoelectronic applications including, but not limited to, optical fiber telecommunications networks.

The system 500 preferably includes a tunable laser 510, which advantageously includes the capacitor, as discussed above, mounted on an outer side of a doped region of the laser 510, in accordance with the principles described herein. As previously mentioned, the capacitor may be used to reduce or eliminate RF signals, as well as the leakage currents they cause, from a tuning region (not illustrated) in the laser 510. By reducing leakage currents in the tuning region, a wavelength of an output of the laser 510 may be substantially maintained, thus significantly preventing wavelength variance.

Also included in the system 500 is a photodetector 520. The photodetector 520 is typically included for receiving input optical signals and transforming between optical and electrical signals formats. Those skilled in the art are familiar with the inclusion of photodetectors in integrated optoelectronic systems. The photodetector 520 may be comprised of metal-semiconductor-metal (MSM) photodiodes, p-i-n diodes, phototransistors, and even avalanche photodiodes. Of course, the present invention is not limited to any particular type of photodetector.

The system 500 further includes a electronics housing 530. Typically, the electronics housing 530 is included in the system 500 to control the function of the several components that make up the system 500. Among the tasks performed within the electronics housing 530 are controlling excessive noise in the various circuits of the system 500, as well as monitoring power in the circuitry of the system 500. The system 500 further includes a wavelength monitor 540. The wavelength monitor 540 may be employed in the system 500 to monitor the wavelength of the optical beam generated by the laser 510 as it is transmitted through an optical fiber 550 located between the laser 510 and a fiber output 560. Those skilled in the art understand the importance of monitoring the wavelength of the output of the system 500, as the context in which the present invention is discussed above demonstrates.

The fiber output 560 provides an output for the system 500 and the optical signals generated therein by the laser 510. The photodetector 520 is also coupled to an optical fiber 550. This optical fiber 550 couples the photodetector 520 to a fiber input 570 for receiving optical signals into the system 500. A lid 580 is also illustrated for covering and protecting the components of the system 500. Electrical terminals (one of which is labeled 590) allow the system 500 to be electrically interconnected with other devices or equipment, as those skilled in the art understand.

Although the present invention has been described in detail, those skilled in the art should understand that they can make various changes, substitutions and alterations herein without departing from the spirit and scope of the invention in its broadest form.

What is claimed is:

1. An optoelectronic device, comprising:
   a substrate having a p-doped region adjacent a first outer surface and an n-type doped region adjacent a second outer surface, wherein said optoelectronic device is a tunable laser and said substrate further includes a gain region, a tuning region, an amplifier region and a modulator region, and wherein said gain region, said tuning region, said amplifier region and said modulator region are located in said p-type doped region;
   a wave guide located in said substrate and located between said first outer surface and said second outer surface; and
   a capacitor located over one of said first outer surface or said second outer surface wherein said capacitor is located on said second outer surface and an electrode of said capacitor is electrically coupled to said p-type doped region.

2. The optoelectronic device as recited in claim 1 further including a metal layer located on one of said first outer surface or said second outer surface, said metal layer comprising a first electrode of said capacitor, a dielectric located over said first electrode and a second electrode located over said dielectric.

3. The optoelectronic device as recited in claim 1 wherein said substrate further includes a grating region.

4. The optoelectronic device as recited in claim 1 wherein said substrate comprises indium phosphide.

5. The optoelectronic device as recited in claim 1 wherein a dielectric layer of said capacitor is a silicon dioxide or a tantalum pentoxide.

6. An integrated opoelectronic system, comprising:
   at least one optical device, including:
      an optical substrate having a p-type doped region adjacent a first outer surface and an n-type doped region adjacent a second outer surface, wherein said optical device is a turnable laser and said optical substrate further includes a gain region, a tuning region, an amplifier region and a modulator region;
      a wave guide located in said substrate and located between said first outer surface and said second outer surface; and
      a capacitor located over one of said first outer surface or said second outer surface, wherein said capacitor is located on said second outer surface and an electrode of said capacitor is electrically coupled to said p-type doped region;
   an optical fiber coupled to said at least one optical device and located on or within said semicoductor substrate; and
   a detector coupled to said at least one optical device.

7. The integrated optoelectronic system as recited in claim 6 further including a metal layer located on one of said first outer surface or said second outer surface, said metal layer comprising a first electrode of said capacitor, a dielectric located over said first electrode and a second electrode located over said dielectric.

8. The integrated optoelectronic system as recited in claim 6 wherein said optical substrate further includes a grating region.

9. The integrated optoelectronic system as recited in claim 6 wherein said optical substrate comprises indium phosphide.

* * * * *